US008253652B2

(12) United States Patent
Koo et al.

(10) Patent No.: US 8,253,652 B2
(45) Date of Patent: Aug. 28, 2012

(54) VOLUMETRIC THREE-DIMENSIONAL DISPLAY PANEL AND SYSTEM USING MULTI-LAYERED ORGANIC LIGHT EMITTING DEVICES

(75) Inventors: Jae-phil Koo, Seoul (KR); Dae-sik Kim, Suwon-si (KR); Su-gun Kim, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 855 days.

(21) Appl. No.: 11/289,322

(22) Filed: Nov. 30, 2005

(65) Prior Publication Data

US 2006/0273983 A1    Dec. 7, 2006

(30) Foreign Application Priority Data

Jun. 1, 2005   (KR) ................. 10-2005-0046733

(51) Int. Cl.
*G09G 5/00*   (2006.01)
(52) U.S. Cl. .............................. 345/6; 345/4
(58) Field of Classification Search ................ 345/4–6, 345/76–83; 315/169.3
See application file for complete search history.

(56) References Cited

U.S. PATENT DOCUMENTS

| | | | | |
|---|---|---|---|---|
| 3,555,349 A * | 1/1971 | Munz | ............................. | 315/383 |
| 4,333,715 A * | 6/1982 | Brooks | ............................ | 352/98 |
| 4,792,723 A | 12/1988 | Igarashi et al. | | |
| 5,490,240 A * | 2/1996 | Foran et al. | .................... | 345/587 |
| 5,745,197 A | 4/1998 | Leung et al. | | |
| 5,780,965 A | 7/1998 | Cass et al. | | |
| 5,847,711 A * | 12/1998 | Kaufman et al. | ............. | 345/424 |
| 5,929,572 A * | 7/1999 | Whitesell | .................... | 315/169.3 |
| 6,252,624 B1 | 6/2001 | Yuasa et al. | | |
| 6,721,023 B1 * | 4/2004 | Weiss et al. | ..................... | 349/87 |
| 7,084,565 B2 * | 8/2006 | Cho et al. | ...................... | 313/504 |
| 7,276,848 B2 * | 10/2007 | Cok et al. | ...................... | 313/504 |
| 2002/0075257 A1 * | 6/2002 | Chartier et al. | ............... | 345/419 |
| 2004/0207599 A1 * | 10/2004 | Kurtenbach et al. | ......... | 345/156 |
| 2004/0222945 A1 * | 11/2004 | Taira et al. | ........................ | 345/6 |
| 2005/0110403 A1 | 5/2005 | Han et al. | | |
| 2005/0280894 A1 * | 12/2005 | Hartkop et al. | ............... | 359/464 |
| 2005/0285826 A1 * | 12/2005 | Park et al. | ........................ | 345/76 |
| 2006/0001615 A1 * | 1/2006 | Kim | ................ | 345/76 |
| 2006/0001617 A1 * | 1/2006 | Shin et al. | ....................... | 345/76 |

(Continued)

FOREIGN PATENT DOCUMENTS

CN   1481203 A   3/2004

(Continued)

OTHER PUBLICATIONS

Search Report issued Dec. 10, 2009, by the Dutch Patent Office in corresponding Application No. NL1031700.

(Continued)

*Primary Examiner* — Alexander Eisen
*Assistant Examiner* — Nelson Lam
(74) *Attorney, Agent, or Firm* — Sughrue Mion, PLLC

(57) ABSTRACT

A volumetric three-dimensional display panel and a volumetric three-dimensional display system employing the volumetric three-dimensional display panel are provided, wherein the volumetric three-dimensional display panel is formed by stacking a plurality of transparent flat display panels, such as, organic light-emitting devices. In the volumetric three-dimensional display panel, two-dimensional images are displayed on the transparent three-dimensional display panels, respectively, to form a single three-dimensional image.

9 Claims, 5 Drawing Sheets

U.S. PATENT DOCUMENTS

| | | | |
|---|---|---|---|
| 2006/0017653 A1* | 1/2006 | Tsao | 345/6 |
| 2006/0097628 A1* | 5/2006 | Suh et al. | 313/504 |
| 2006/0181201 A1* | 8/2006 | Tsai et al. | 313/504 |
| 2006/0214596 A1* | 9/2006 | Miller et al. | 315/169.3 |

FOREIGN PATENT DOCUMENTS

| | | |
|---|---|---|
| EP | 1093008 A | 4/2001 |
| EP | 1441548 A2 | 7/2004 |
| JP | 11-265785 A | 9/1999 |
| JP | 11-354275 A | 12/1999 |
| JP | 2000-243564 A | 9/2000 |
| KR | 10-2005-0045768 A | 5/2005 |
| WO | 91-12554 A1 | 8/1991 |
| WO | 99/54849 A1 | 10/1999 |

OTHER PUBLICATIONS

Communication dated Jul. 31, 2011 from the Korean Patent Office in a counterpart application No. 10-2005-0046733.

* cited by examiner

VOLUMETRIC THREE-DIMENSIONAL DISPLAY PANEL AND SYSTEM USING MULTI-LAYERED ORGANIC LIGHT EMITTING DEVICES

CROSS-REFERENCE TO RELATED PATENT APPLICATIONS

This application claims the benefit of priority from Korean Patent Application No. 10-2005-0046733, filed on Jun. 1, 2005, in the Korean Intellectual Property Office, the disclosure of which is incorporated herein in its entirety by reference.

BACKGROUND OF THE INVENTION

1. Field of the Invention

Apparatuses and systems consistent with the present invention relate to a volumetric three-dimensional (3D) display panel and a volumetric 3D display system using the volumetric 3D display panel, and more particularly, to a volumetric 3D display panel formed by stacking a plurality of transparent display panels like organic light-emitting devices and to a volumetric 3D display system using the volumetric 3D display panel.

2. Description of the Related Art

A 3D image is formed according to the principle of a stereoscopic vision through two eyes of a human being. A binocular parallax, which is generated due to separation of two eyes by about 65 mm, is considered to be an important factor in generating a cubic effect. In various fields, such as medical images, games, advertisement, education, and military affairs, 3D image display based on the binocular parallax principle is recently in great demand. Moreover, with gradual popularization of high-resolution televisions (TVs), popularization of 3D TVs through which viewers can view 3D images is anticipated in the future. Hence, various stereoscopic display techniques have been proposed.

General stereoscopic display techniques are roughly classified into a glasses-based stereoscopic display technique, a glass-less stereoscopic display technique, and a perfect stereoscopic 3D display technique.

In both a glasses-based stereoscopic display technique and a glass-less stereoscopic display technique, two two-dimensional (2D) images having parallax therebetween are provided to the left eye and the right eye, respectively, of a human to provide a stereoscopic effect. However, the glasses-based stereoscopic display technique requires a viewer to wear a special accessory, such as polarization eyeglasses, to enjoy a 3D image. In the glass-less stereoscopic display technique, only a viewer positioned at a predetermined location can view a 3D image, because only one viewing zone or several separated viewing zones are inconsecutively fixed. Furthermore, both the glasses-based and glass-less stereoscopic display techniques have a limit in that only a depth of an object is reproduced; that is, viewers cannot enjoy all of the images of an object as viewed in various directions.

To solve these problems, the perfect stereoscopic 3D display technique has been proposed, in which a convergence angle made by the left and right eyes viewing an image is consistent with a focal point of the two eyes so that a perfect 3D image can be recognized. Examples of the perfect stereoscopic 3D display technique include integral photography and holography. However, the integral photography has a disadvantage in that a parallax range and a viewing angle obtained by a lens are restricted. The holography has disadvantages in that a coherent light source, such as a laser, is required and that recording and reproducing a large object located at a far distance is difficult.

A volumetric 3D display technique also a form of a perfect stereoscopic 3D display technique. FIG. 1 schematically illustrates a conventional volumetric 3D display device employing a volumetric 3D display technique. Referring to FIG. 1, the conventional volumetric 3D display device includes a projector 10 for projecting an image and a multi-plate optical panel 11 on which the image projected from the projector 10 lands. The multi-plate optical panel 11 is a stack of a plurality of optical plates 11a through 11e. Each of the optical plates 11a through 11e is, for example, a controllable, variable, semitransparent liquid crystal device. When turned off, the optical plates 11a through 11e become transparent. When turned on, the optical plates 11a through 11e enter into an opaque light-scattering state. The optical plates 11a through 11e are controlled in this way.

In this structure, the projector 10 produces a 3D image on the multi-plate optical panel 11 by consecutively projecting a plurality of images having different depths onto the optical plates 11a through 11e using a time-division technique. More specifically, the projector 10 sequentially projects first through fifth images Im1 through Im5 onto the optical plates 11a through 11e according to a time-division technique. At this time, one of the optical plates 11a through 11e enters into an opaque light-scattering state when a corresponding image is projected from the projector 10, and the other optical plates enter into transparent states. Then, the first through fifth images Im1 through Im5 sequentially land on the optical plates 11a through 11e, respectively. Since the projection of the plurality of images is accomplished within a very short period of time, an observer feels the plurality of images like a single 3D image Im6. Hence, a visual effect where a 3D object seems to be formed within a space is obtained.

However, the projector 10 should perform a raster at ultrahigh speed to produce a natural 3D image from a plurality of 2D images. To display a 3D image without flickering, the projector 10 should project the plurality of 2D images onto the optical plates 11a through 11e at a speed of at least 1.5 Khz to 2 Khz. Hence, the conventional volumetric 3D display device requires a projector capable of projecting an image at a speed of several thousands of Hz.

FIG. 2 schematically illustrates another conventional volumetric 3D display device. In the conventional volumetric 3D display device of FIG. 2, a projector 20 consecutively projects images onto a bent screen 22 installed within a cylindrical frame 21 and simultaneously rotates the screen 22 at high speed, thereby obtaining a 3D image. However, in this conventional volumetric 3D display device, a motor (not shown) for rotating the screen 22 may generate noise, and forming a large volumetric 3D display system using a large screen is difficult due to friction between the screen 22 and the frame 21 and to air resistance. Furthermore, a volumetric 3D display system using this conventional volumetric 3D display device is prone to break due to the friction and air resistance, so that the lifespan of the system decreases.

SUMMARY OF THE INVENTION

The present invention provides a volumetric 3D display panel capable of producing a more complete 3D image in a simple scheme and with low costs, and a volumetric 3D display system using volumetric 3D display panels.

According to an aspect of the present invention, there is provided a volumetric three-dimensional display panel comprising a plurality of transparent flat display panels which are stacked, on which two-dimensional images are displayed, respectively, to form a single three-dimensional image.

The transparent flat display panels may be organic light-emitting devices.

Each of the transparent flat display panels may include a transparent substrate, a first transparent electrode formed on the transparent substrate, an organic light-emitting layer formed on the first transparent electrode, and a second transparent electrode formed on the organic light-emitting layer. Each of the transparent flat display panels may have a thickness of 2 mm or less.

According to another aspect of the present invention, there is provided a volumetric three-dimensional display system including a volumetric three-dimensional display panel and a controller. The volumetric three-dimensional display panel is a stack of a plurality of transparent flat display panels. The controller distributes a plurality of two-dimensional images having depth information to the transparent flat display panels according to the depth information. The two-dimensional images are displayed on the transparent flat display panels to form a single three-dimensional image.

The controller may include a coordinate transformation unit and a multiplexer. The coordinate transformation unit transforms a coordinate of an input three-dimensional image into a coordinate of the volumetric three-dimensional display panel to divide the input three-dimensional image into a plurality of two-dimensional images according to depth information. The multiplexer distributes the plurality of two-dimensional images having depth information to the transparent flat display panels according to the depth information.

The controller may further include an interaction unit for rotating, translating, or zooming in/out the input three-dimensional image according to a user's command.

BRIEF DESCRIPTION OF THE DRAWINGS

The above and other aspects of the present invention will become more apparent by describing in detail exemplary embodiments of the present invention with reference to the attached drawings in which.

DETAILED DESCRIPTION OF EXEMPLARY EMBODIMENTS OF THE INVENTION

Figure 1:
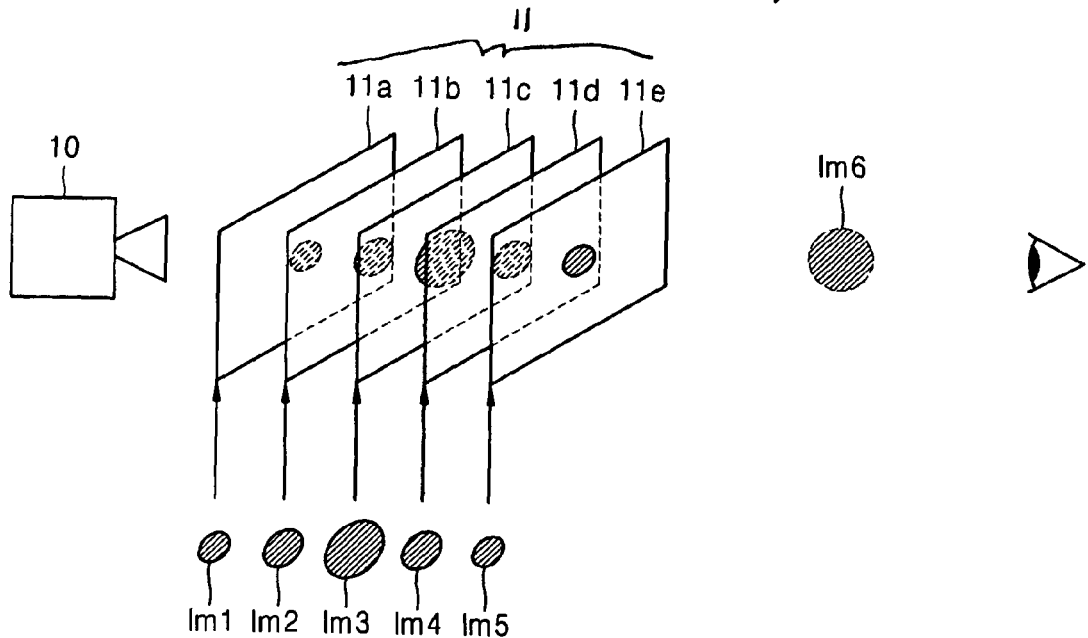
FIG. 1 schematically illustrates a conventional volumetric 3D display device.
Figure 2:
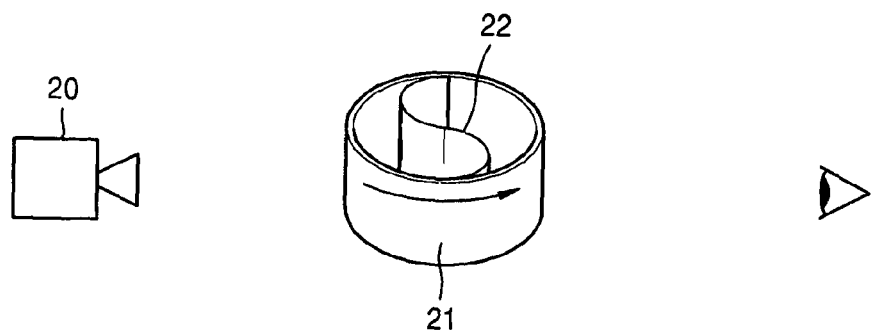
FIG. 2 schematically illustrates another conventional volumetric 3D display device.
Figure 3:
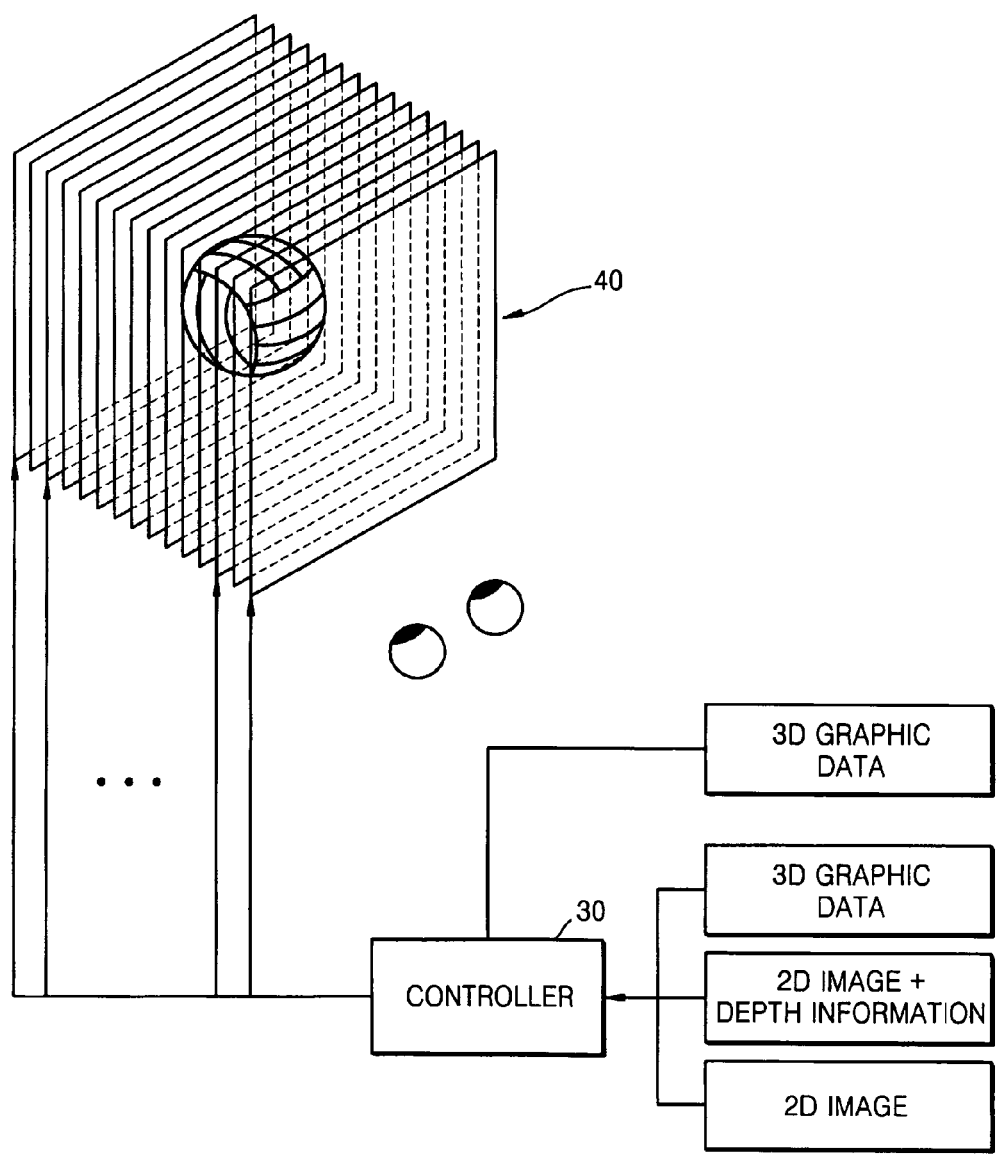
FIG. 3 schematically illustrates a volumetric 3D display system according to an exemplary embodiment of the present invention.

FIG. 3 schematically illustrates a volumetric 3D display system according to an exemplary embodiment of the present invention. As shown in FIG. 3, the volumetric 3D display system includes a volumetric 3D display panel 40 and a controller 30. The volumetric 3D display panel 40 is a stack of a plurality of transparent flat display panels. The controller 30 distributes a plurality of 2D images having depth information to the plurality of transparent flat display panels according to the depth information of the 2D images and displays the 2D images on the transparent flat display panels. The volumetric 3D display panel 40 is formed by stacking a plurality of thin, transparent flat display panels.

In the volumetric 3D display system having this structure, each of the transparent flat display panels displays a 2D image. The 2D images displayed on the transparent flat display panels are images into which a 3D image is divided according to depth information. The controller 30 distributes these of 2D images to the corresponding transparent flat display panels according to the depth information. Since the flat display panels are transparent, an observer recognizes the plurality of 2D images displayed on the flat display panels as a single complete 3D image having a depth.

In the above-described volumetric 3D display system, the display panels are self-illuminated to display images, so that no high-resolution projectors, which are expensive, are required. Consequently, the entire size and price of the system can be greatly reduced. Furthermore, there is no need to turn on/off the multi-plate optical panel in synchronization with the points of time when a projector projects the images, so that the system of the controller 30 is simplified. In terms of a method of rotating a screen at high speed, the above-described volumetric 3D display system does not generate noise or vibration caused by a motor.

As described above, thin, transparent flat display panels form the volumetric 3D display system of FIG. 3. Examples of widely used flat display panels include liquid crystal panels (LCDs), organic light-emitting devices (OLEDs), plasma display panels (PDPs) or other flat display panels known in the art. However, LCDs require a backlight because they are not self-illuminated, and PDPs have difficulty in becoming thinner and consume much power. On the other hand, OLEDs consume only a half the power consumed by LCDs despite of being self-illuminated, can have a thickness equal to or less than ⅓ of the thickness of an LCD, and have a wide visual angle and a response speed of about 1000 times as fast as LCDs. Moreover, OLEDs have a simple structure and thus can be easily manufactured, and OLEDs can be formed to be transparent according to the materials of a substrate and electrodes. Thus, OLEDs among widely used flat display panels possess suitable characteristics for manufacturing a volumetric 3D display system according to an exemplary embodiment of the present invention.

Figure 4:
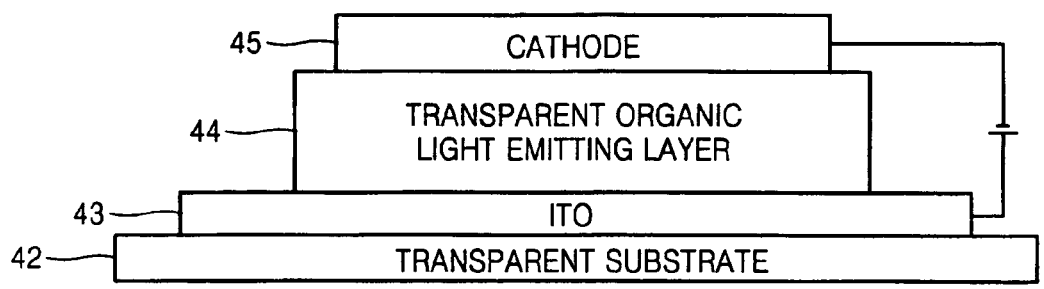
FIG. 4 is a cross-sectional view illustrating a structure of an organic electroluminescence (EL) display panel used in the volumetric 3D display system of FIG. 3.

FIG. 4 is a cross-sectional view illustrating a structure of such an OLED used in the volumetric 3D display system of FIG. 3. As shown in FIG. 4, the OLED generally includes a transparent substrate 42, a transparent electrode 43, such as an indium tin oxide (ITO) layer, formed on the transparent substrate 42, a transparent organic light-emitting layer 44 formed on the transparent electrode 43, and a cathode 45 formed on the transparent organic light-emitting layer 44. The transparent substrate 42 may be made of glass or plastic. Plastic is lighter and more flexible than glass. However, plastic is less transparent than glass and has a higher thermal expansion coefficient than glass. However, due to a recent use of a transparent nano fiber with a diameter of 100 nm or less as a reinforcing material, it is possible to manufacture a polymer substrate that is flexible and transparent enough to have a parallel ray transmittance of greater than about 85% and that has a low thermal expansion coefficient similar to that of glass. The transparent electrode 43 may be made of ITO. The transparent organic light-emitting layer 44 is formed of a monomer material, such as $Alq_3$, Anthracene, or other monomer material known in the art, or a polymer material, such as, poly(p-phenylenevinylene) (PPV), polythiophene (PT), or other polymer material known in the art. To enhance light emission efficiency, an electron transport layer (not shown) may be interposed between the cathode 45 and the transparent organic light-emitting layer 44, and a hole transport layer (not shown) may be interposed between the transparent electrode 43, which is an anode, and the transparent organic light-emitting layer 44.

The cathode 45 may be formed of metal having a relatively low work function. Recently, a transparent organic light emitting device (TOLED) by which viewers can view an image through both a front side and a rear side has been developed by forming the cathode 45 as a transparent electrode. The entire flat display panel except for a portion on which an image is displayed can be transparent by rendering electrodes on both sides of the organic light-emitting layer 44 transparent. Hence, such a TOLED may also be used in manufacturing the volumetric 3D display panel 40.

Figure 5:
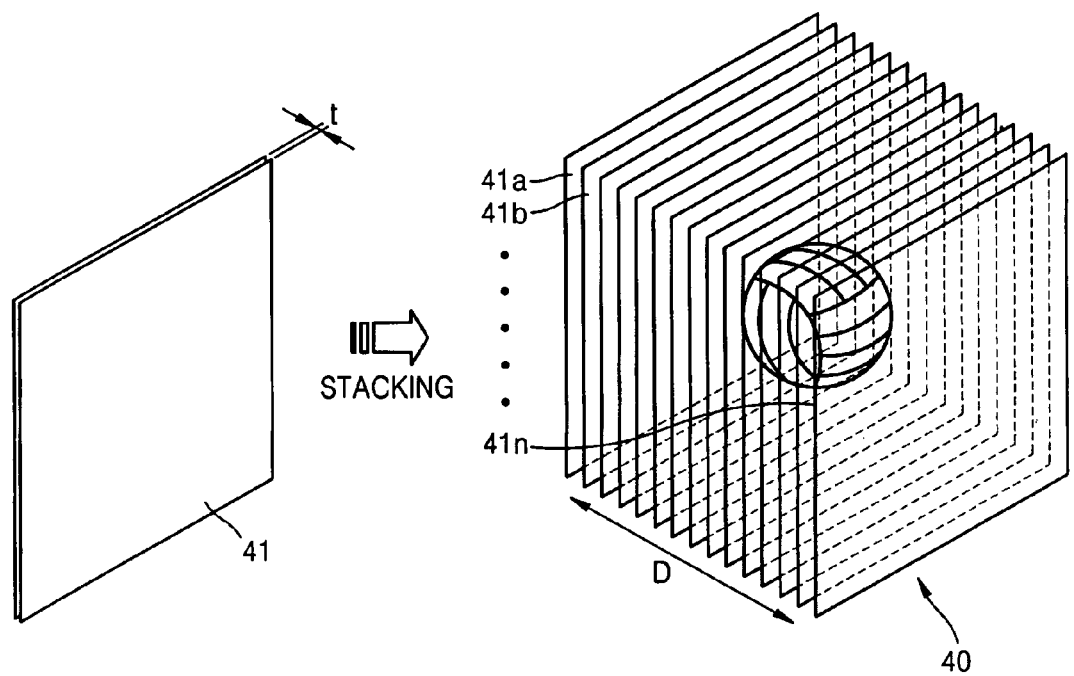
FIG. 5 schematically illustrates a volumetric 3D display panel formed by stacking transparent EL display panels illustrated in FIGS. 4A and 4B.

FIG. 5 schematically illustrates the volumetric 3D display panel 40 formed by stacking the transparent flat display panels 41. As shown in FIG. 5, the volumetric 3D display panel 40 is formed by stacking the thin, transparent flat display panels 41, i.e., panels 41a through 41n, without gaps. In this case, using a substrate having a small thermal expansion coefficient as a substrate included in each of the transparent flat display panels 41 is preferable to stably maintain junctions between adjacent flat display panels 41. In this structure, since each of the flat display panels 41 is transparent, any of the images displayed on the flat display panels 41 can be recognized by a viewer. Hence, the volumetric 3D display panel 40 can be considered as a 3D configuration of pixels. The pixels of the volumetric 3D display panel 40 can be referred to voxels. In other words, if a picture element of a single flat display panel is called a pixel, a pixel having a thickness is referred to as a voxel.

The volumetric 3D display panel 40 of FIG. 5 can provide a more complete 3D image with an increase in the number of flat display panels 41 stacked. Also, the volumetric 3D display panel 40 can provide a more precise 3D image with a decrease in the thickness of each of the flat display panels 41. For example, the thickness of each of the flat display panels 41 is preferably equal to or less than about 2 mm.

Figure 6:
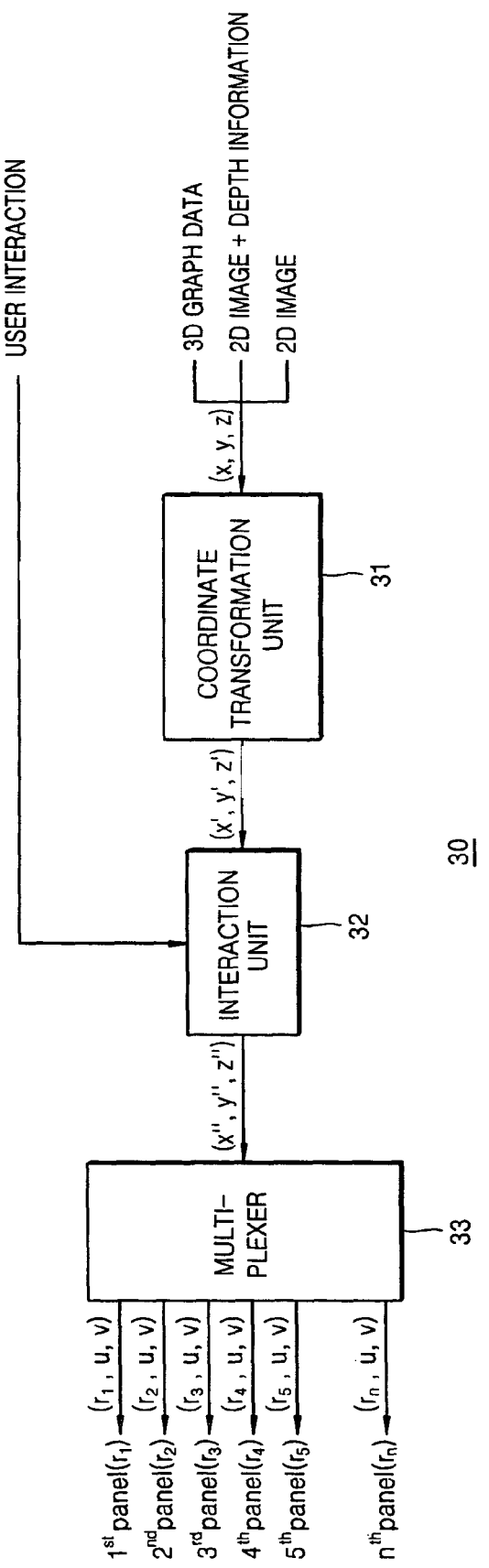
FIG. 6 is a block diagram of a structure of a controller of the volumetric 3D display system of FIG. 3.

As described above, the volumetric 3D display system of FIG. 3 produces a three-dimensional effect by overlapping a plurality of 2D images on another. Accordingly, the controller 30 distributes the 2D images to the flat display panels 41 of the volumetric 3D display panel 40 of FIG. 5. FIG. 6 is a block diagram of a structure of the controller 30 of the volumetric 3D display system of FIG. 3.

As shown in FIG. 6, the controller 30 includes a coordinate transformation unit 31 for producing a coordinate for an image to be displayed on the volumetric 3D display panel 40, an interaction unit 32 for processing the image in various forms according to a user's command, and a multiplexer 33 for distributing image data to the flat display panels 41 of the volumetric 3D display panel 40.

Examples of formats of 3D image data that can be generally input to the volumetric 3D display panel 40 include 3D graphic data, a combination of a 2D image and depth information, pure 2D image data, a composition of graphics, and a real picture, etc. The coordinate transformation unit 31 transforms a coordinate of 3D image data having the aforementioned formats so that the image data can be efficiently displayed by the volumetric 3D display system. Examples of the coordinate of the 3D image data include a Cartesian coordinate, a cylindrical coordinate, a spherical coordinate, or a coordinate of another coordinate system known in the art. Since the volumetric 3D display panel of FIG. 3 is a rectangular parallelepiped, the coordinates of the 3D image data are transformed into Cartesian coordinates. In other words, the coordinate transformation unit 31 divides a to-be-displayed 3D image into a plurality of 2D images (which are expressed in x-coordinates and y-coordinates in this example) according to a depth value (which may be, for example, expressed as a z-coordinates).

The coordinate-transformed 2D images are distributed to the flat display panels of the volumetric 3D display panel 40 via the multiplexer 33. In other words, the multiplexer 33 converts depth values of the 2D images to be output into physical depth values in consideration of the number of flat display panels and provides the 2D images to the corresponding flat display panels according to the physical depth values. If n flat display panels, namely, first through n-th flat display panels, are used, the multiplexer 33 sequentially distributes the 2D images to the first through n-th flat display panels in a sequence of the depth values of the 2D images. Then, the 2D images are respectively displayed on the first through n-th flat display panels. A user recognizes the overlapped 2D images as a single 3D image.

Interaction capable of varying an image, is useful in 3D display. For example, images are commonly varied by rotating, translating, zooming, scaling or other methods known in the art. Hence, as shown in FIG. 6, the controller 30 further includes the interaction unit 32 to vary the 2D images output from the coordinate transformation unit 31 according to a user command. The images varied by the interaction unit 32 are distributed to the flat display panels of the volumetric 3D display panel 40 via the multiplexer 33 and displayed thereon.

As described above, in a volumetric 3D display system according to an exemplary embodiment of the present invention, a plurality of transparent display panels are self-illuminated to display images, so that an expensive high-resolution projector is not needed. Thus, the entire size of the system can be greatly reduced, and the price thereof can also be greatly reduced. Additionally, there is no need to execute an action necessary in a conventional display system, that is, synchronization of an on/off operation of the multi-plate optical panel with projection of images by a projector, so that control system of the system is simplified. In particular, when organic light-emitting devices are used as the transparent flat display panels, a response speed is very high. Thus, the volumetric 3D display system according to an exemplary embodiment of the present invention can more efficiently display a 3D image than a conventional display system using a projector.

Furthermore, the volumetric 3D display system according to an exemplary embodiment of the present invention does not generate noise or vibration caused by a motor when compared with a conventional display system employing a method of rotating a screen at high speed.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A volumetric three-dimensional display system comprising:
   a volumetric three-dimensional display panel comprising a stack of a plurality of transparent flat display panels; and
   a controller which distributes a plurality of two-dimensional images, each having depth information, to the transparent flat display panels according to the depth information, wherein the plurality of two-dimensional images are displayed on the plurality of transparent flat display panels to form a three-dimensional image,
wherein each transparent flat display panel is stacked without gaps between each transparent flat display panel, and
wherein the controller comprises:
  a coordinate transformation unit which transforms a coordinate of an input three-dimensional image into a coordinate of the volumetric three-dimensional display panel to divide the input three-dimensional image into a plurality of two-dimensional images according to depth values; and
  a multiplexer which converts the depth values of the plurality of two-dimensional images into physical depth values according to the number of the plurality of transparent flat display panels, and distributes the plurality of two-dimensional images to the plurality of transparent flat display panels according to the physical depth values.

2. The volumetric three-dimensional display system of claim 1, wherein each of the plurality of transparent flat display panels is an organic light-emitting device.

3. The volumetric three-dimensional display system of claim 1, wherein the controller further comprises an interaction unit which rotates, translates, or zooms the input three-dimensional image according to a command.

4. The volumetric three-dimensional display system of claim 1, wherein the coordinate of the input three-dimensional image is a cylindrical coordinate.

5. The volumetric three-dimensional display system of claim 1, wherein the coordinate of the input three-dimensional image is a spherical coordinate.

6. The volumetric three-dimensional display system of claim 2, wherein each of the plurality of transparent flat display panels comprises:
  a transparent substrate;
  a first transparent electrode which is formed on the transparent substrate;
  an organic light-emitting layer which is formed on the first transparent electrode; and
  a second transparent electrode which is formed on the organic light-emitting layer.

7. The volumetric three-dimensional display system of claim 6, wherein each of the plurality of transparent flat display panels has a thickness of approximately 2 mm or less.

8. The volumetric three-dimensional display system of claim 6, wherein each of the plurality of transparent flat display panels further comprises:
  an electron transport layer interposed between the organic light-emitting layer and the second transparent electrode.

9. The volumetric three-dimensional display system of claim 8, wherein each of the plurality of transparent flat display panels further comprises:
  a hole transport layer interposed between the first transparent electrode and the organic light-emitting layer.

* * * * *